(12) United States Patent
Ogawa et al.

(10) Patent No.: US 8,940,810 B2
(45) Date of Patent: Jan. 27, 2015

(54) OPTICAL COMPONENT, ELECTRONIC BOARD, METHOD FOR PRODUCING THE OPTICAL COMPONENT, AND METHOD FOR PRODUCING THE ELECTRONIC BOARD

(71) Applicant: Canon Kabushiki Kaisha, Tokyo (JP)

(72) Inventors: Ryo Ogawa, Kawasaki (JP); Seiji Okada, New Hyde Park, NY (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/910,483

(22) Filed: Jun. 5, 2013

(65) Prior Publication Data

US 2013/0331477 A1 Dec. 12, 2013

(30) Foreign Application Priority Data

Jun. 7, 2012 (JP) .................. 2012-130083

(51) Int. Cl.
| | | |
|---|---|---|
| *C08J 3/28* | (2006.01) | |
| *C08F 2/46* | (2006.01) | |
| *C08G 61/04* | (2006.01) | |
| *C08F 12/32* | (2006.01) | |
| *C08F 212/32* | (2006.01) | |
| *H05K 1/03* | (2006.01) | |
| *H05K 1/02* | (2006.01) | |
| *H05K 1/18* | (2006.01) | |

(52) U.S. Cl.
CPC .............. *C08F 12/32* (2013.01); *C08F 212/32* (2013.01); *H05K 1/032* (2013.01); *H05K 1/0298* (2013.01); *H05K 1/181* (2013.01); *H05K 2201/068* (2013.01); *H05K 2201/10121* (2013.01)
USPC ............... 522/160; 522/157; 522/150; 522/1; 522/161; 520/1

(58) Field of Classification Search
CPC ...... C08F 12/32; C08F 212/32; C08F 220/14; H05K 1/00
USPC .................. 522/160, 157, 150, 1, 161; 520/1
See application file for complete search history.

(56) References Cited

FOREIGN PATENT DOCUMENTS

| JP | 2005-280261 A | 10/2005 |
|---|---|---|
| JP | 2006-172822 | * 6/2006 |

OTHER PUBLICATIONS

Shintani, 2006, JP 2006-172822 Machine Translation.*
So, Ying-Hung et al, Styrene 4-Vinylbenzocyclobutene Copolymer for microelectronic applications, Jan. 9, 2008, Journal of POlymer Science, Part A: Polymer Chemistry, vol. 46, 2799-2806.*
Yu, Yuanlie et al, The synthesis of novel fluorine-containing randome polymer and appliation in modifcation of a solid surface, Jun. 19, 2010, Surface & Coatings Technology, 205-212.*
Ying-Hung So, et al., Journal of Polymer Science:Part A:Polymer Chemistry,vol. 46, pp. 2799-2806 (2008),"Styrene 4-Vinylbenzocyclobutene Copolymer for Microelectronic Applications".

* cited by examiner

*Primary Examiner* — Ling Choi
*Assistant Examiner* — Jessica E Whiteley
(74) *Attorney, Agent, or Firm* — Canon USA, Inc. IP Division

(57) ABSTRACT

An optical component and an electrical board that have a low coefficient of linear expansion and small mold shrinkage, a method for producing the optical component, and a method for producing the electronic board are provided. An optical component includes a polymer having a repeating structural unit represented by general formula (1)

General formula (1)

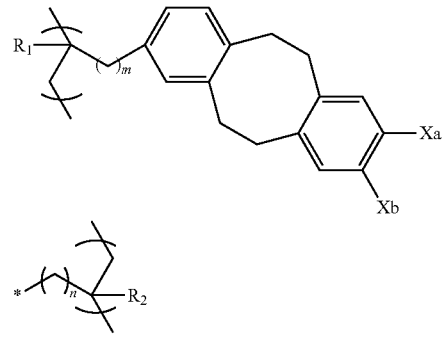

where $R_1$ and $R_2$ each independently represent —H or —$CH_3$; m and n each independently represent an integer in the range of 0 to 3; asterisk denotes a dangling bond that bonds to one of Xa and Xb; and —H bonds to the other one of Xa and Xb.

7 Claims, 3 Drawing Sheets

OPTICAL COMPONENT, ELECTRONIC BOARD, METHOD FOR PRODUCING THE OPTICAL COMPONENT, AND METHOD FOR PRODUCING THE ELECTRONIC BOARD

BACKGROUND OF THE INVENTION

1. Field of the Invention

The present invention relates to an optical component and an electronic board that have a low coefficient of linear expansion and small mold shrinkage, a method for producing the optical component, and a method for producing the electronic board.

2. Description of the Related Art

Plastics that are light-weight and easy to mold are useful for forming optical components (lenses, mirrors, etc.) and electronic boards (printed boards etc.). These optical components and electronic boards are expected to be used in various temperature environments during production and use. Thus, materials that do not readily undergo thermal deformation, in other words, materials that have low coefficients of linear expansion and do not significantly shrink during molding are desired.

In general, in the field of optical components, cyclic olefin polymers are used in optical components such as lenses since cyclic olefin polymers have a low water absorbing property and high transparency. In the field of electronic boards, resins such as polyimides having high heat resistance are mainly used in printed boards and substrates for mounting semiconductors.

However, in order for materials to be used in high precision optical components that realize high resolution and in electronic boards with a significantly high degree of integration, the coefficient of linear expansion is desirably low. In particular, cyclic olefin polymers have high coefficients of linear expansion and the usage thereof is significantly limited. In contrast, polyimides have significantly low coefficients of linear expansion but poor moldability and thus usage of the polyimides has been limited.

Journal of Polymer Science: Part A: Polymer Chemistry, Vol. 46, p. 2799 to 2806 (2008), "Styrene 4-Vinylbenzocyclobutene Copolymer for Microelectronic Applications" reports that the glass transition temperature (Tg) and the heat resistance improved in a thin film having a thickness of 4 μm obtained by crosslinking a copolymer of vinylbenzocyclobutene and methyl methacrylate.

Japanese Patent Laid-Open No. 2005-280261 discloses a polymer composed of a polyfunctional (meth)acrylate compound and reports that a molded article that has a low coefficient of linear expansion can be produced.

However, the coefficient of linear expansion disclosed in the aforementioned monograph in Journal of Polymer Science does not satisfy the recent requirement of high performance for use in optical components and electronic boards and thus the usage of the material is limited. Moreover, the polymer disclosed in the monograph in Journal of Polymer Science described above has many limitations as to the methods for molding although favorable coefficients of linear expansion are obtained owing to the (meth)acrylate compound. Moreover, the mold shrinkage caused by polymerization of (meth)acryl groups is significantly large and the material is difficult to use in optical components and electronic boards.

The present invention provides an optical component and an electronic board that have a low coefficient of linear expansion and small mold shrinkage.

SUMMARY OF THE INVENTION

An aspect of the present invention provides an optical component that includes a polymer having a repeating structural unit represented by general formula (1)

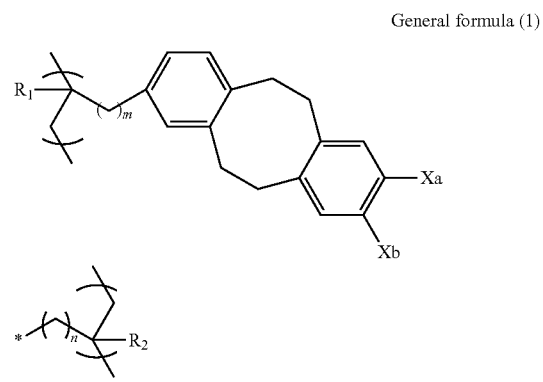

General formula (1)

where $R_1$ and $R_2$ each independently represent —H or —$CH_3$; m and n each independently represent an integer in the range of 0 to 3; asterisk denotes a dangling bond that bonds to one of Xa and Xb; and —H bonds to the other one of Xa and Xb.

Further features of the present invention will become apparent from the following description of exemplary embodiments with reference to the attached drawings.

DESCRIPTION OF THE EMBODIMENTS

Figure 1:
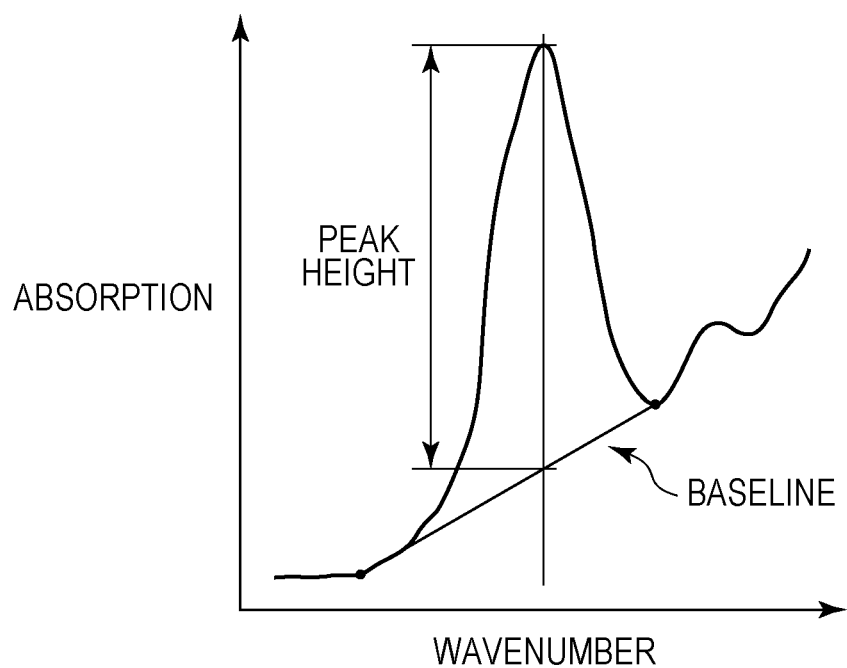
FIG. 1 is a graph used to calculate the height of an absorption peak.

Embodiments of the present invention will now be described in detail.

An optical component and an electronic board according to embodiments of the present invention are each made using a polymer that has a repeating structural unit represented by general formula (1) below.

An optical component and an electronic board according to other embodiments of the present invention are each made using a polymer that has a repeating structural unit represented by general formula (1) and a repeating structural unit represented by general formula (2) below.

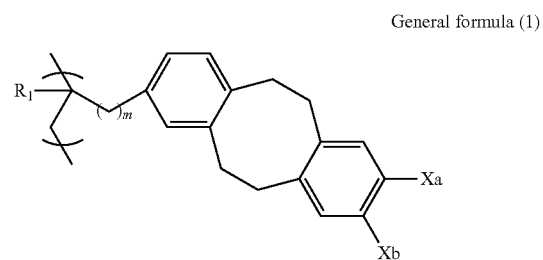

General formula (1)

-continued

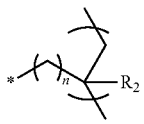

where $R_1$ and $R_2$ each independently represent —H or —$CH_3$; m and n each independently represent an integer in the range of 0 to 3; asterisk denotes a dangling bond that bonds to one of Xa and Xb; and —H bonds to the other one of Xa and Xb.

General formula (2)

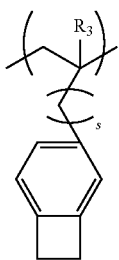

where $R_3$ represents —H or —$CH_3$ and s represents an integer in the range of 0 to 3.

An optical component and an electronic board that are made by using a polymer having a repeating structural unit represented by general formula (1) are made of a crosslinking material made from a polymer having a repeating structural unit represented by general formula (1). For example, the crosslinked material can be obtained by heat molding a vinyl polymer having a benzocyclobutenyl group, which is a polymer that has a repeating structural unit represented by general formula (2) below obtained by polymerizing a benzocyclobutene monomer having a vinyl group represented by general formula (4) below.

General formula (4)

General formula (2)

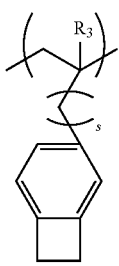

In general formulae (2) and (4), $R_3$ represents —H or —$CH_3$ and represents an integer in the range of 0 to 3.

In the present invention, a crosslinked material refers to a crosslinked polymer.

The present invention can provide an optical component and an electronic board that have a low coefficient of linear expansion and small mold shrinkage and can be crosslinked by heat molding. The crosslinked material according to an embodiment is suitable for use in an optical component and an electronic board. Examples of the optical component and the electronic board include optical lenses, light guiding plates, protective films, deflection films, phase difference films, touch panels, transparent electrode substrates, optical recording discs such as compact discs (CDs), minidiscs (MDs), and digital versatile discs (DVDs), TFT substrates, electronic materials and prepregs such as sealing materials for color filter substrates, resin clad copper foils, printed wiring boards, and antenna substrates.

Studies have revealed that increasing the crosslinking ratio of the crosslinked material according to an embodiment of the present invention notably decreases the coefficient of linear expansion. In general, increasing the crosslinking ratio causes shrinking due to crosslinking. However, in the present invention, even when the crosslinked material of the invention is used to form an optical component or an electronic board 100 μm or more in thickness by heat molding, for example, the change in density is very small. Thus the crosslinked material is found to be particularly suitable for use in recent optical components and electronic boards that require high shape accuracy. Benzocyclobutene monomer having a vinyl group A monomer represented by general formula (4) can be synthesized by a known method such as one reported in Kirchhoff et al. (PCT. Int. Appl. (1987), WO87/05303, pp. 113) and Endo et al. (Journal of Polymer Science, Part A: Polymer Chemistry (1995), 33(4), pp. 707-15).

In the monomer represented by general formula (4), $R_3$ may be —H from the viewpoint of thermal stability of the polymer. Moreover, as for s, molecular motions are enhanced and the coefficient of linear expansion is increased if s is excessively large. For the usage of the present invention, s is preferably an integer in the range of 0 to 3 and more preferably 0.

In particular, when $R_3$ is —H and s is 0, the monomer represented by general formula (4) is 4-vinylbenzocyclobutene represented by chemical formula (5) below.

Chemical formula (5)

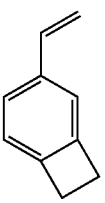

Vinyl Polymer Having a Benzocyclobutenyl Group

A vinyl polymer that has a benzocyclobutenyl group represented by general formula (2) can be obtained by, for example, a known polymerization method such as radical polymerization or anion polymerization of a benzocyclobutene monomer having a vinyl group represented by general formula (4).

The polymerization method for obtaining a vinyl polymer having a benzocyclobutenyl group is not particularly limited and any of known methods may be appropriately employed. Examples of the known polymerization methods include a solution polymerization method, an emulsion polymerization method, a soap free emulsion polymerization method, a solvent-free polymerization method that uses only monomers, a suspension polymerization method, a radical polymerization method, an anion polymerization method, a photo polymerization method, and a thermal polymerization method. In order to conduct polymerization, a polymerization initiator may be appropriately selected and used. The polymerization initiator may be an azo thermal polymerization initiator (2,2'-azobisisobutyronitrile or the like), a peroxide polymerization initiator (benzoyl peroxide or the like), a water-soluble polymerization initiator (ammonium persulfate or the like), an anion polymerization initiator (n-butyl lithium or the like), or a photo polymerization initiator (1-hydroxy-cyclohexyl-phenyl-ketone or the like). When a solvent is to be used, a known solvent such as tetrahydrofuran, toluene, xylene, isopropanol, or water may be appropriately selected and used. If needed, an alkane thiol such as n-dodecanethiol may be used as a chain transfer agent to adjust the molecular weight.

Various conditions of the polymerization reaction can be appropriately set based on the polymerization method employed and are not particularly limited. The polymerization initiator content is preferably about 0.01 to about 10 mol % relative to monomers and more preferably 0.01 to 1 mol % in order to appropriately adjust the molecular weight of the polymer. The monomer concentration is preferably 10 to 100% by weight but more preferably 30% by weight to 60% by weight in order to suppress gelation during polymerization, accelerate progress of the polymerization reaction, and maintain high yield. The amount of the chain transfer agent added may be 0 to 100 mol % relative to the monomers and is preferably 0.1 mol % to 10 mol %. The polymerization reaction atmosphere may be air but is preferably an inert atmosphere such as nitrogen in order to suppress inhibition of polymerization by oxygen. The polymerization temperature may be appropriately selected within the range of −100° C. to 150° C. based on the polymerization initiator but can be in the range of 40° C. to 80° C. due to ease of controlling the polymerization reaction. The polymerization reaction time may be about 1 to about 48 hours and more preferably about 4 to about 12 hours.

In order to remove unreacted monomers after the polymerization reaction, purification may be conducted by a reprecipitation method, a distillation method, or the like. When a reprecipitation method is employed, a solution in which the polymer is dissolved may be added to a known solvent, such as acetone, methanol, or hexane, that dissolves the monomers but not the vinyl polymer having a benzocyclobutenyl group. As a result, the polymer settles and can be recovered as a solid matter from which the monomers have been removed.

The molecular weight of the vinyl polymer having a benzocyclobutenyl group is not particularly limited. From the viewpoint of workability during heat molding, the number-average molecular weight may be within the range of 2,000 to 200,000. In particular, when the molecular weight is low, the mobility of the polymer chain is increased and the reactivity of the crosslinking reaction is enhanced during the production of the crosslinked material. Thus, the crosslinking ratio becomes sufficiently high even by a crosslinking treatment at a low temperature. As a result, the crosslinking ratio can be efficiently increased at low temperature within a short time, decomposition reaction of the vinyl polymer main chains presumed to occur simultaneously with crosslinking is suppressed, and thus a small coefficient of linear expansion can be achieved. In order to achieve such features, a polymer having a number-average molecular weight of 2,000 to 10,000 or a glass transition temperature of 115° C. or lower is more preferable. Due to ease of handling of the polymer before crosslinking, the number-average molecular weight is most preferably within the range of 4,000 or more and 8,000 or less. The chain transfer agent may be appropriately used to obtain a polymer having a desired molecular weight.

Examples of the chain transfer agent added to control the molecular weight include commonly known transfer agents such as alkyl mercaptans (n-butylmercaptan, n-pentylmercaptan, n-octylmercaptan, n-laurylmercaptan, and tert-dodecylmercaptan), thiophenols (thiophenol, m-bromothiophenol, p-bromothiophenol, m-toluenethiol, and p-toluenethiol), and 2,4-diphenyl-4-methyl-1-pentene(α-methylstyrene).

The polymer may be a homopolymer that has a repeating structural unit represented by general formula (1). Alternatively, a third structural unit that does not have a benzocyclobutenyl group may be introduced into the polymer by copolymerization. Examples of the monomers used for the copolymerization in order to form the third structural unit include (meth)acrylic monomers such as methyl methacrylate and vinyl monomers such as styrene. However, if the amount of the third structural unit not contributing to crosslinking other than the vinyl monomer that has a benzocyclobutenyl group is increased, the effects of the present invention may not be sufficiently achieved. Accordingly, the amount of the monomer that does not have a benzocyclobutenyl group in the polymer may be 1 mol % or more and 70 mol % or less in terms of molar ratio. The increase in amount of structural units not contributing to crosslinking presumably contributes to decreasing the coefficient of linear expansion. In order not to decrease the crosslinking ratio of the crosslinked material, the amount is more preferably 1 mol % or more and 20 mol % or less.

When $R_3$ is —H and s is 0 in general formula (2), a 4-vinylbenzocyclobutene polymer represented by chemical formula (6) is given.

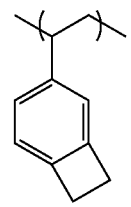

Chemical formula (6)

Crosslinked Material According to an Embodiment

A crosslinked material according to an embodiment has a structural unit represented by general formula (1) and a structural unit represented by general formula (2). When the total content of the structural unit represented by general formula (1) and the structural unit represented by general formula (2) is assumed to be 100% by weight, the content of the structural unit represented by general formula (1) is 20% by weight or more and less than 100% by weight. Alternatively, the crosslinked material may be free of the structural unit represented by general formula (2) and the content of the structural unit represented by general formula (1) may be 100% by weight.

The crosslinked material according to this embodiment is obtained by heating the polymer described above and no crosslinking agents or crosslinking aids are needed. The crosslinked material can be easily obtained without generating by-products such as ethylene. The crosslinked material obtained also has a low coefficient of linear expansion. Moreover, since crosslinking occurs by ring opening, shrinkage which is assumed to occur by formation of chemical bonds in general becomes significantly small, the change in density rarely occurs during molding, and shape failures such as sink marks are suppressed. Since the mold shrinkage is small, an optical component formed by using the crosslinked material according to the present invention can effectively suppress deterioration of images. If the crosslinked material is used to form an electronic board of the present invention, it becomes possible to accurately mount circuits on the electronic board. The crosslinked material of this embodiment of the present invention has transparency and low birefringence and is thus suitable for use in optical applications. With an uncrosslinked material, aromatic rings of benzocyclobutene groups become stacked during molding and become oriented, thus tending to generate slight birefringence. However, since a crosslinked material obtained by heating is used, stacking of aromatic rings is moderated and the birefringence can be decreased. The crosslinked material according to this embodiment of the present invention is suitable for making an optical component.

The crosslinked material according to this embodiment may have a structure represented by general formula (1). In general formula (1), $R_1$ and $R_2$ each independently represent —H or —$CH_3$ and m and n each independently represent an integer in the range of 0 to 3. From the viewpoint of thermal stability of the crosslinked material, $R_1$ and $R_2$ preferably each represent —H and m and n preferably each represent 0 in order to suppress motion of the crosslinked structure for realizing a low coefficient of linear expansion. In particular, the crosslinked material comes to have a structural unit represented by general formula (3) below when $R_1$ and $R_2$ are each —H and m and n are each 0.

General formula (3)

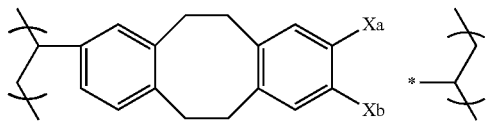

In the formula, asterisk represents a dangling bond that bonds to one of Xa and Xb and —H bonds to the other one of Xa and Xb.

The crosslinked material according to this embodiment is obtained by performing a heat treatment and/or a microwave irradiation treatment on a vinyl polymer having a benzocyclobutenyl group represented by general formula (2).

When the benzocyclobutenyl group in general formula (2) is heated to 180° C. or higher, the four membered ring opens, a dimerization reaction occurs, and the structure represented by general formula (1) is obtained. The dimerization reaction of the benzocyclobutenyl groups causes crosslinking of the main chains of the vinyl polymer. As reported in Marks et al. (Macromolecule (1994), 27, pp. 4114 to 4126), the dimerization reaction gives structures represented by general formulae (7) and (8) below.

General formula 7

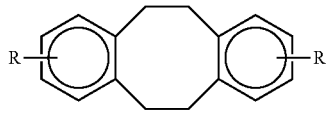

General formula 8

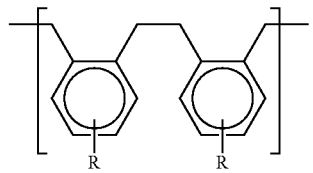

In general formulae (7) and (8), R represents a structure represented by general formula (9) below.

General formula (9)

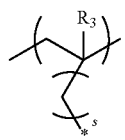

In general formula (9), asterisk represents a dangling bond that bonds to R of general formula (7) or (8), $R_3$ represents H or —$CH_3$, and s represents an integer within the range of 0 to 3.

The thermal motion of the polymer main chains is suppressed and the coefficient of linear expansion is reduced presumably due to formation of crosslinking structures derived from the benzocyclobutenyl groups in the crosslinked material of the present invention as discussed above. In order to achieve the effects of the present invention, the crosslinking ratio of the vinyl polymer having the benzocyclobutenyl group represented by general formula (2) is 20% or more and 100% or less, preferably 40% or more and 100% or less, and more preferably 95% or more and 100% or less. In terms of the content of the structural unit represented by general formula (1), the content of the structural unit represented by general formula (1) in the polymer that has a repeating structural unit represented by general formula (1) and a repeating structural unit represented by general formula (2) (in other words, the content of the structural unit represented by general formula (1) when the total content of the structural unit represented by general formula (1) and the structural unit represented by general formula (2) is assumed to be 100% by weight) is 20% by weight or more and less than 100% by weight, preferably 60% by weight or more and less than 100% by weight, more preferably 95% by weight or more and less than 100% by weight, and most preferably 100% by weight. When the crosslinking ratio is 20% or more and 100% or less, the coefficient of linear expansion of the crosslinked material according to the present invention becomes 40 ppm/K or less and such a crosslinked material is suitable as a material for scanning optical systems and mirrors. When the crosslinking ratio is 40% or more and 100% or less, the coefficient of linear expansion of the crosslinked material according to the present invention is 30 ppm/K or less and such a crosslinked material is suitable as a material for imaging optical systems such as lenses and electronic boards, for example.

The optical component and the electronic board of the present invention may contain a filler that improves mechanical properties, electrical properties, and optical properties of the polymer, as long as the effects of the present invention are not impaired. The filler used is not particularly limited and may be composed of an inorganic material or an organic material.

Examples of the inorganic material include silicon oxide, metal oxides, diamond, metal multiple oxides, metal sulfides, metal compound semiconductors, and metals. Examples of the metal oxides include aluminum oxide, titanium oxide, niobium oxide, tantalum oxide, zirconium oxide, zinc oxide, magnesium oxide, tellurium oxide, yttrium oxide, indium oxide, tin oxide, and indium tin oxide. Examples of the metal multiple oxides include lithium niobate, potassium niobate, and lithium tantalate. Examples of the metal compound semiconductors include metal sulfides such as zinc sulfide and cadmium sulfide, zinc selenide, cadmium selenide, zinc telluride, and cadmium telluride. Examples of the metals include gold. Core-shell inorganic particles prepared by coating inorganic particles of one type with an inorganic component of another type may also be used. The shape of the inorganic particles may be spherical, elliptic, flat, or rod-like.

When the optical component described below requires transparency, the average primary particle diameter of the inorganic material is preferably 30 nm or less and more preferably 10 nm or less in order to suppress scattering of the inorganic material. In this description, the average primary particle diameter refers to a particle diameter measured with a transmission electron microscope (TEM).

Examples of the organic material include wood flour, starch, organic pigments, polystyrene, nylon, polyolefins such as polyethylene and polypropylene, vinyl chloride, various types of elastomers, and waste plastics.

In addition to the inorganic and organic materials described above, staples and filaments such as chopped strands and milled fibers can be used as the filler. Examples of the type of the fibers include inorganic fibers such as glass fibers, carbon fibers, and metal fibers; and organic fibers such as aramid fibers, nylon fibers, jute fibers, kenaf fibers, bamboo fibers, polyethylene fibers, stretched polyethylene fibers, polypropylene fibers, and stretched polypropylene fibers.

A flame retardant may be used as a filler. Examples of the flame retardant include those composed of inorganic materials such as metal hydroxides and those composed of organic materials such as compounds containing phosphorus, compounds containing halogens, and compounds containing nitrogen. From the viewpoint of reducing the environmental load, a flame retardant composed of a metal hydroxide may be used. Examples of the flame retardant composed of a metal hydroxide include aluminum hydroxide, magnesium hydroxide, basic magnesium oxide, and dawsonite.

The optical component and the electronic board according to the present invention may contain known additives such as an antideterioration agent, a ultraviolet preventing agent, an antioxidant, a light stabilizer, a plasticizer, and an infrared absorber.

The antioxidant is not particularly limited as long as it is a material that suppresses deterioration of the optical component by oxidation. Examples thereof include phenolic antioxidants, phosphoric antioxidants, and sulfuric antioxidants. Of these, phenolic antioxidants and in particular an alkyl-substituted phenol antioxidant are preferred. When these antioxidants are blended, coloring and the decrease in strength caused by oxidation during molding can be prevented without degrading the transparency and heat resistance.

The light stabilizer may be any material that suppresses deterioration of the optical component caused by irradiation with light. Examples of the light stabilizer include benzophenone light stabilizers, benzotriazole light stabilizers, and hindered amine light stabilizers. In this embodiment, a hindered amine light stabilizer may be used from the viewpoints of transparency and resistance to coloring.

As disclosed in Examples below, the coefficient of linear expansion of a polymer (component A) having a structural unit represented by general formula (1) and an uncrosslinked structural unit represented by general formula (2) can reach 20 ppm/K. The coefficient of linear expansion of a resin (component B) other than the component A contained in the optical component and the electronic board of the present invention is typically presumed to be about 70 ppm/k (methyl methacrylate, for example). Assuming that the density of the component A and the component B is substantially the same, the coefficient of linear expansion is calculated in accordance with the sum rule: 20 (coefficient of linear expansion according Example of the present invention)×0.6 (% by weight of component A)+75 (coefficient of linear expansion of common resin)×0.4 (% by weight of component B)=40 ppm/K. The result shows that 60% by weight or more of the component A is required in order to sufficiently achieve the effects of the present invention. In order for the optical component and electronic board of the present invention to achieve a favorable coefficient of linear expansion, the polymer having a structural unit represented by general formula (1) and an uncrosslinked structural unit represented by general formula (2) preferably accounts for 60% by weight or more and more preferably 95% or more and 100% or less of the organic components excluding inorganic components.

The organic component content in the optical component and the electronic board can be determined by a known method such as thermogravimetric (TG) analysis. The amount of the crosslinked material having a structural unit represented by general formula (1) and the amount of the uncrosslinked polymer represented by general formula (2) in the organic components can be determined by a known analytical technique such as nuclear magnetic resonance measurement, Fourier transform infrared spectroscopy, thermo gravimetric differential thermal analysis mass spectroscopy, and elemental analysis.

Method for Calculating Crosslinking Ratio of the Benzocyclobutenyl Group

The crosslinking ratio of the crosslinked material according to the present invention can be defined through the following method.

The crosslinked material is subjected to Fourier transform infrared spectroscopy (FT-IR) measurement to obtain an absorption spectrum. In FT-IR measurement, a transmission method, a total reflection method, or other suitable method may be freely employed.

In the FT-IR spectrum of the crosslinked material, a decrease in peak at about 1475 $cm^{-1}$ and an increase in peak at about 1500 $cm^{-1}$ are observed between before and after the crosslinking reaction, thus enabling identification of the structure of the crosslinked material. The intensity of the peak at 820 $cm^{-1}$ attributable to the aromatic ring remains unchanged.

The crosslinking ratio can be calculated by using the height or area of the peaks of the FT-IR absorption spectrum.

To be specific, in the case where the height of the peak is determined from an absorption spectrum, as shown in FIG. 1, a baseline is drawn relative to the peak, a perpendicular line is drawn from the peak top, and then the height from the intersection between the perpendicular line and the baseline to the apex of the peak is determined.

In calculating the crosslinking ratio of the crosslinked material according to the present invention, the height of a peak at 1475 $cm^{-1}$ attributable to the benzocyclobutenyl group (BCB) represented by general formula (2) is determined for both the crosslinked material for which the crosslinking ratio is calculated and the uncrosslinked polymer by the process described above. In the same manner, the height of the peak at 820 cm$^{-1}$ attributable to the benzene ring (Bz) is determined for both the crosslinked material and the uncrosslinked polymer. Then the crosslinking ratio is calculated from equation (1) below using the heights of the peaks.

$$\text{Crosslinking ratio}(\%)=100\times[1-\{(BCB_x/Bz_x)/(BCB_0/Bz_0)\}] \quad (1)$$

$BCB_x$: Height of the peak at 1475 cm$^{-1}$ attributable to BCB of the crosslinked material for which the crosslinking ratio is determined.

$Bz_x$: Height of the peak at 820 cm$^{-1}$ attributable to Bz of the crosslinked material for which the crosslinking ratio is determined.

$BCB_0$: Height of the peak at 1475 cm$^{-1}$ attributable to BCB of the uncrosslinked polymer.

$Bz_0$: Height of the peak at 820 cm$^{-1}$ attributable to Bz of the uncrosslinked polymer.

In the case where the calculation is conducted by using the area, the area of the region surrounded by the peak and the baseline is used instead of the peak height in equation (1) in order to determine the crosslinking ratio.

Method for Producing a Crosslinked Material

A method for producing a crosslinked material according to this embodiment includes performing a heat treatment and/or a microwave irradiation treatment on the vinyl polymer having a benzocyclobutenyl group.

The heating temperature in the heating treatment may be any temperature at which the four membered ring of the benzocyclobutenyl group of the polymer opens. The heating temperature is preferably 180° C. to 400° C. and more preferably 200° C. to 300° C. This is because sufficient crosslinking does not occur and the coefficient of the linear expansion is not sufficiently decreased at a low heating temperature and thermal decomposition of the polymer and the crosslinked material start at a high heating temperature.

The frequency of microwaves used in the microwave irradiation treatment may be any frequency at which the ring of the benzocyclobutenyl group of the polymer opens. Usually, microwaves having a frequency of 2.45 GHz or 5.8 GHz are used. The frequency of the microwaves used refers to a frequency in a 2.45 GHz band ranging 2,450±50 MHz or a frequency in a 5.8 GHz band ranging 5,800±75 MHz according to ISM bands. Irradiation with microwaves may be conducted two or more times under different conditions. The temperature during microwave irradiation is not particularly limited but is preferably 50° C. to 400° C., more preferably 80° C. to 300° C., and most preferably 100° C. to 200° C.

The heat treatment and the microwave irradiation treatment may be performed simultaneously or one after another (either treatment may be performed first).

From the viewpoint of preventing oxidation of the crosslinked material of the present invention, the atmosphere for the heat treatment and/or the microwave irradiation treatment may be an inert atmosphere such as argon, helium, or nitrogen.

Optical Component

Figure 2A:
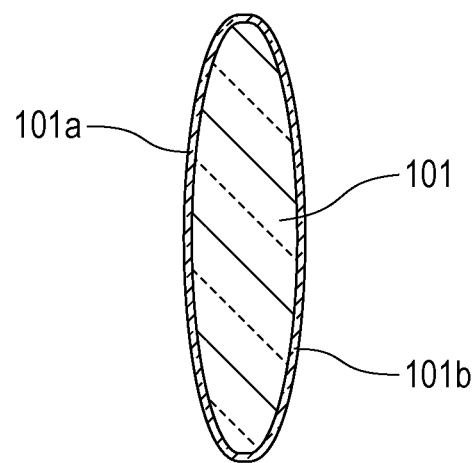
FIGS. 2A and 2B are cross-sectional views of lenses according to embodiments of optical components of the present invention.
Figure 2B:
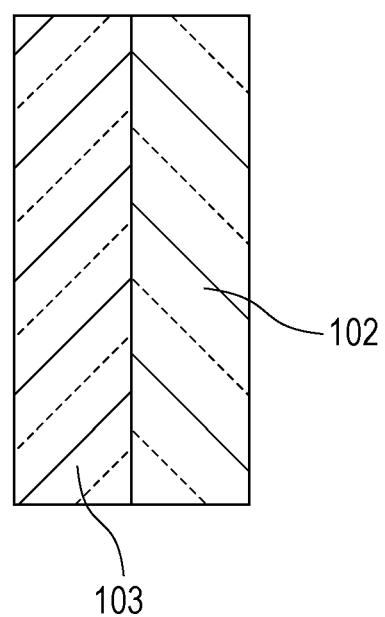

Examples of the optical component according to embodiments of the present invention will now be described with reference to FIGS. 2A and 2B. FIG. 2A illustrates an optical lens which is a convex lens composed of an optical component 101 according to the present invention. FIG. 2B illustrates an optical lens that includes a substrate 103 composed of an inorganic material such as glass and an optical component 102 according to the present invention disposed on the substrate 103.

The optical lens may have an antireflection film or a hard coat depicted as 101a or 102b in FIG. 2A on the surface. An intermediate layer may be provided between the antireflection film and the optical component according to the present invention. The antireflection film is not particularly limited but may have a refractive index close to the refractive index of the convex lens. The intermediate layer is not particularly limited and may be composed of a material that has a refractive index at the midpoint between the refractive index of the convex lens and the refractive index of the antireflection film. In order to decrease internal reflection in the convex lens, a substantially opaque film for the wavelength zone used may be formed in a portion that does not transmit light, for example, in a side end portion (outer edge) of the convex lens.

The optical component according to the present invention shrinks little during molding and the shape failures such as sink marks are suppressed. Thus the optical component is suitable for optical usage. Moreover, when the crosslinking ratio is 20% or more and 100% or less, the coefficient of linear expansion of a crosslinked material according to the present invention becomes 40 ppm/K or less and the crosslinked material is suitable for use in scanning optical systems and a mirror disposed between an object lens and an imaging element. When the crosslinking ratio is 40% or more and 100% or less, the coefficient of linear expansion of a crosslinked material according to the present invention becomes 30 ppm/K or less and the crosslinked material is suitable for use in imaging optical systems such as optical lenses and optical prisms.

Examples of the optical component according to the embodiment include optical lenses and optical prisms such as imaging-system lenses of cameras; lenses such as microscope lenses, endoscope lenses, and telescope lenses; lenses that transmit all light such as eyewear lenses; lenses for optical disc usage such as pickup lenses for optical discs such as CDs, CD-ROMs, write-once-read-many discs (WORMs), MOs (rewritable optical discs or optomagnetic discs), MDs, and DVDs; lenses for scanning optical systems such as fθ lenses of laser beam printers and laser scanning system lenses such as lenses for sensors; and prism lenses of finder systems of cameras. Other examples include mirrors disposed between object lenses and imaging elements; light guiding plates for liquid crystal displays; optical films such as polarization films, phase difference films, and light scattering films; light scattering plates; and optical cards.

Imaging System Lenses of Cameras

An optical component according to this embodiment may be an imaging system lens of a camera among these examples. As for the shape of the lens, the lens may be a spheric lens, an aspheric lens, a Fresnel lens, a lenticular lens, a semi-cylindrical lens, or a cylindrical lens. These lenses are used in, for example, cellular phones equipped with lenses, digital cameras, DVDs, optical communication devices, car-mounted cameras, web cameras, and projectors. The lens may be incorporated in a camera module widely used in cellular phones equipped with lenses and digital cameras etc.

When the optical component of this embodiment is used as a lens, the maximum thickness is preferably 0.1 mm or more from the viewpoint of lens performance, and more preferably 0.1 to 5 mm and most preferably 1 to 3 mm. The total light transmittance is preferably 70% or more on a 1 mm thickness basis at 550 nm wavelength, and more preferably 75% or more and most preferably 80% or more. The coefficient of linear expansion may be 40 ppm or less.

When the optical component of this embodiment is used as a lens, an antireflection film may be provided on the lens surface and an intermediate layer may be provided between the antireflection film and the lens. The antireflection film is not particularly limited and may have a refractive index close to the refractive index of the lens. The intermediate layer is not particularly limited and may be composed of a material having a refractive index between the refractive index of the lens and the refractive index of the antireflection film. The lens surface refers to a surface of a lens and the antireflection film may be provided on all surfaces of a lens, some of the surfaces of a lens, or a part of a surface of a lens. The antireflection film may be disposed at least on a main surface of a lens.

Method for Producing an Optical Component

An example of a method for producing an optical component of this embodiment will now be described. An optical component is produced by preparing the polymer having a benzocyclobutenyl group described above and molding the prepared polymer. The molding method is not particularly limited and a molding method suitable for the shape of a desired optical component may be used. Examples of the molding method include an injection molding method, a transfer molding method, a blow molding method, a rotational molding method, a vacuum molding method, an extrusion molding method, a calender molding method, a solution casting method, a hot press molding method, an inflation method, and a solvent casting method.

The optical component can be used in a variety of forms, such as spherical, bar-shape, plate-shape, cylindrical, tubular, fibrous, film-shape, and sheet-shape.

A method for producing an optical lens which is an example of the optical component will now be described. An optical lens is obtained by molding the polymer into a desired lens shape. The molding method is not particularly limited and may be a melt molding method in order to obtain a molded product having excellent properties such as low birefringence, mechanical strength, and dimensional accuracy. Examples of the melt molding method include commercial press molding, commercial extrusion molding, and commercial injection molding. Injection molding may be employed since the molding performance and productivity are high.

The molding conditions are appropriately selected according to the purpose of usage and the molding method. For example, the temperature of the polymer during injection molding may be in the range of 100° C. to 400° C. The molding may be conducted in an inert gas atmosphere or in vacuum. After the polymer is injected into a mold, the temperature is increased to a temperature equal to or higher than the temperature at which dimerization reaction of the benzocyclobutenyl group occurs. In this temperature range, the polymer exhibits an appropriate degree of flowability during molding, sink marks and strains are rarely generated in molded products, the incidence of the silver streaks caused by thermal decomposition of the polymer is low, and yellowing of the molded products is suppressed. When molding is conducted in an inert gas atmosphere or in vacuum, yellowing of the molded products is significantly suppressed.

Electronic Board

An example of an electronic board according to the present invention will now be described by using a printed board shown in FIG. 3 as an example.

Figure 3:
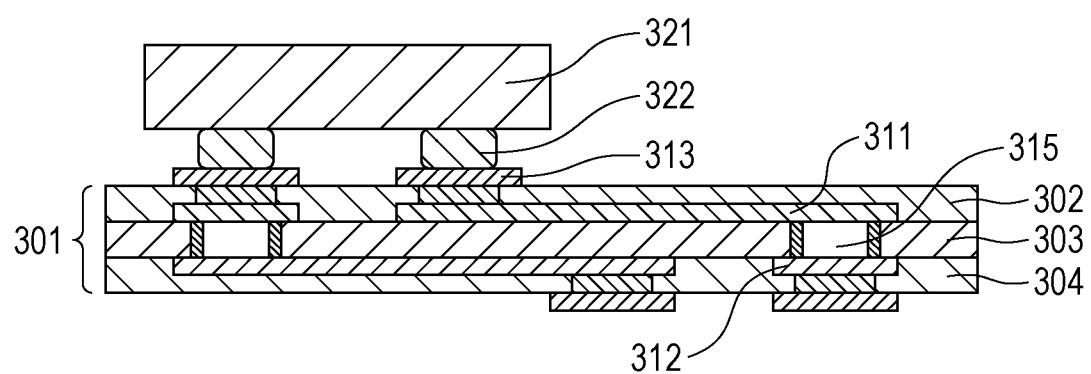
FIG. 3 is a cross-sectional view of a printed board according to an embodiment of an electronic board according to the present invention.

A printed board 301 illustrated in FIG. 3 includes wiring layers 302, 303, and 304. An electronic part 321 is mounted on the printed board 301.

The wiring layers 302, 303, and 304 are composed of a polymer according to the present invention having a low coefficient of linear expansion. Wiring patterns 311 and 312 are formed in the surfaces of the wiring layers. Terminals 313 are disposed on a surface of the outermost wiring layer 302 and connected to electrodes 322 of the electronic part 321.

Through holes 315 are formed in the wiring layer 303. The through holes 315 are electrically connected to the wiring patterns 311 and 312 formed in the wiring layers 302 and 304.

The wiring patterns 311 and 312 function as ground wiring, power supply wiring, or signal wiring and may be composed of a metal material such as copper having high electrical conductivity. The wiring patterns 311 and 312 have a thickness of, for example, 0.2 μm or more and 1 μm or less. For example, in order to form a wiring pattern 311 with a copper foil, an etching resist is silk-printed onto a copper foil, the portions of the foil not covered with the etching resist are removed, and then the remaining etching resist is removed to form a wiring pattern in the copper foil. In order to insulate between the wiring patterns and in order not to have solder adhered to unintended portions during a soldering step, a solder resist may be silk-printed and then cured with ultraviolet light to achieve insulation.

The wiring layers 302, 303, and 304 increase the strength of wiring and the thickness of each layer is set to, for example, 0.1 mm or more and 1 mm or less. The coefficient of linear expansion in the surface direction and in the thickness direction may be set to be in the range of 5 ppm/K or more and 30 ppm/K or less, for example, so that the coefficient matches the coefficient of linear expansion of the electronic part 321 mounted and the wiring patterns 311 and 312.

When the crosslinking ratio of the crosslinked material used in forming the electronic board of the present invention is 20% or more and 100% or less, the coefficient of linear expansion of the crosslinked material comes to be 30 ppm/K or less, the mold shrinkage is small, and the accuracy of surfaces on which wiring is formed is high. Thus, the crosslinked material is suitable for use in printed wiring boards and build-up substrates. For example, the crosslinked material is suitable for use in electronic boards mounted in various audio visual appliances, household electrical appliances, communication devices, computer systems, accessories thereof, and the like.

Method for Producing an Electronic Board

An example of a method for producing an electronic board according to the present invention will now be described. The molding method employed in producing an electronic board is not particularly limited and may be a melt molding method in order to obtain a molded product having excellent properties such as mechanical strength and dimensional accuracy. Examples of the melt molding method include commercial press molding, commercial extrusion molding, an commercial injection molding. Injection molding may be employed since the molding performance and productivity are high.

The molding conditions are appropriately selected according to the molding method. For example, the temperature of the polymer during injection molding may be in the range of 100° C. to 400° C. The molding may be performed in an inert gas atmosphere or in vacuum. After the polymer is injected in a mold, the temperature is increased to a temperature equal to or higher than the temperature at which dimerization reaction of the benzocyclobutenyl group occurs. In this temperature range, the polymer exhibits an appropriate degree of flowability during molding, sink marks and strains are rarely generated in molded products, the incidence of silver streaks caused by thermal decomposition of the polymer is low, and yellowing of the molded products is suppressed. When molding is conducted in an inert gas atmosphere or in vacuum, yellowing of the molded products is significantly suppressed.

EXAMPLES

The present invention will now be described in detail by using Examples which do not limit the scope of the present invention. The number-average molecular weight (Mn) and weight-average molecular weight (Mw), glass transition temperature, coefficient of linear expansion, crosslinking ratio, and density used in Examples and Comparative Example were determined by methods described below.

(1) Number-Average Molecular Weight (Mn) and Weight-Average Molecular Weight (Mw)

A gel permeation chromatograph (GPC) (produced by Waters) was used. Two Shodex LF-804 columns (produced by Showa Denko K.K.) were arranged in series, the temperature was set to 40° C., and THF was used as an eluent. The molecular weight was measured with a refractive index (RI, differential refractive index) detector. The number-average molecular weight and the weight-average molecular weight are in terms of standard polystyrene equivalent.

(2) Glass Transition Temperature (Tg)

Glass transition temperature was determined with a differential scanning calorimeter (DSC7020 produced by SII Nano Technology) in accordance with Japanese Industrial Standard (JIS) K7121 by heating a sample from 30° C. to 145° C. at a heating rate of 10° C./min and then heating the sample from 30° C. to 200° C.

(3) Coefficient of Linear Expansion

Based on JIS-K7197 Determination of coefficient of linear thermal expansion by thermomechanical analysis of a plastic, an obtained cured product was cut into an oblong specimen having a length of 1 cm. The specimen was loaded in a thermomechanical analyzer (Thermo Plus EVO TMA8310 produced by Rigaku Corporation) and heated and cooled twice from −40° C. to 80° C. at a rate of 5° C./min under a nitrogen stream (100 mL/min). The average coefficient of thermal expansion during second heating from 0° C. to 40° C. was determined.

(4) Measurement of Crosslinking Ratio

A molded product was analyzed with a Fourier transform infrared spectroscope (Spectrum One produced by PerkinElmer Co., Ltd.) by an attenuated total reflection (ATR) technique. A peak at about 1475 $cm^{-1}$ and a peak at about 820 $cm^{-1}$ were used to calculate the crosslinking ratio from equation (1) above. The crosslinking ratio obtained and the amount (% by weight) of PVBCB in the molded product were used to calculate the amount in terms of the percent by weight of the crosslinked structure represented by general formula (1) in the molded product.

(5) Measurement of Density

A cylindrical molded product was prepared and the surface area, height, and weight of the molded product were measured. The density of the molded product was determined from the volume and the weight.

Example 1

Polymerization of 4-vinylbenzocyclobutene

In 10 mL of tetrahydrofuran, 6.50 g (5 mmol) of 4-vinylbenzocyclobutene was dissolved and then 8.14 mg (0.05 mmol) of 2,2'-azobisisobutyronitrile was dissolved. The mixture was placed in a glass tube. The glass tube was purged with nitrogen gas and hermetically sealed. The hermetically sealed glass tube was heated to 74° C. in an oil bath and polymerization was conducted for 48 hours. The polymer obtained was diluted with 50 mL of tetrahydrofuran and the diluted solution was added to a large volume of methanol dropwise so as to recover a 4-vinylbenzocyclobutene polymer as deposits.

The polymer recovered was dissolved in a deuterated chloroform solution and analyzed with a proton nuclear magnetic resonance analyzer ($^1$H NMR) (Avance 600 MHz produced by Bruker BioSpin K.K.) by using tetramethylsilane as a standard for chemical shift to confirm absence of remaining monomers and the chemical structure of the polymer.

$^1$H NMR (600 MHz, $CDCl_3$): δ 6.95-5.87 (3H), 3.08 (4H), 2.29-0.91 (3H)

The molecular weight of the 4-vinylbenzocyclobutene polymer obtained by GPC was Mn=18.5×10$^3$, Mw=57.6× 10$^4$. The glass transition temperature determined by DSC was 119° C.

The 4-vinylbenzocyclobutene polymer was heated under a nitrogen stream at a heating rate of 10° C./min to 900° C. by using a thermogravimetric analyzer (TG-DTA, Thermo Plus TG 8120 produced by Rigaku Corporation), and heat resistance of that polymer was examined. As a result, the 4-vinylbenzocyclobutene polymer turned into a crosslinked material as the crosslinking reaction proceeded during heating and exhibited high heat resistance, namely, a 5% by weight decomposition temperature of 436° C.

Production of Crosslinked Material

The 4-vinylbenzocyclobutene polymer (200 mg) was placed in a cylindrical mold (10 mm in diameter, 1.2 mm in height) and molding was conducted at 230° C. for 30 minutes while applying a pressure of 3 ton under a nitrogen stream to obtain a crosslinked material. The crosslinking ratio of the crosslinked material was calculated by FT-IR as mentioned above and the coefficient of linear expansion was calculated by TMA as mentioned above. The crosslinking ratio was 23% and the amount of the crosslinked structure represented by general formula (1) contained in the molded product was 23% by weight, and the coefficient of linear expansion was 39 ppm/K.

The transmittance of the crosslinked material (thickness: 1.2 mm) at 587 nm wavelength was measured with a UV-VIS NIR spectrophotometer (SolidSpec-3700 produced by Shimadzu Corporation). The crosslinked material showed high transparency, namely, a transmittance of 69%.

Example 2

A crosslinked material was obtained as in Example 1 except that the 4-vinylbenzocyclobutene polymer described in Example 1 was heat molded at 230° C. for 60 minutes. The crosslinking ratio of the resulting crosslinked material was 41% and the amount of the crosslinked structure represented by general formula (1) contained in the molded product was 41% by weight and the coefficient of linear expansion was 24 ppm/K. The transmittance at 587 nm wavelength was measured as in Example 1. The transmittance was 77% and high transparency was exhibited.

Example 3

A crosslinked material was obtained as in Example 1 except that the 4-vinylbenzocyclobutene polymer described in Example 1 was heat molded at 230° C. for 90 minutes. The crosslinking ratio of the resulting crosslinked material was 50% and the amount of the crosslinked structure represented by general formula (1) contained in the molded product was 50% by weight and the coefficient of linear expansion was 21 ppm/K. The transmittance at 587 nm wavelength was measured as in Example 1. The transmittance was 67% and high transparency was exhibited.

Example 4

A crosslinked material was obtained as in Example 1 except that the 4-vinylbenzocyclobutene polymer described in Example 1 was heat molded at 230° C. for 120 minutes. The crosslinking ratio of the resulting crosslinked material was 50% and the amount of the crosslinked structure represented by general formula (1) contained in the molded product was 50% by weight and the coefficient of linear expansion was 20 ppm/K. The transmittance at 587 nm wavelength was measured as in Example 1. The transmittance was 66% and high transparency was exhibited.

Example 5

A crosslinked material was obtained as in Example 1 except that the 4-vinylbenzocyclobutene polymer described in Example 1 was heat molded at 250° C. for 90 minutes. The crosslinking ratio of the resulting crosslinked material was 91% and the amount of the crosslinked structure represented by general formula (1) contained in the molded product was 91% by weight and the coefficient of linear expansion was 24 ppm/K. The transmittance at 587 nm wavelength was measured as in Example 1. The transmittance was 68% and high transparency was exhibited.

Example 6

A crosslinked material was obtained as in Example 1 except that the 4-vinylbenzocyclobutene polymer described in Example 1 was heat molded at 290° C. for 10 minutes. The crosslinking ratio of the resulting crosslinked material was 100% and the amount of the crosslinked structure represented by general formula (1) contained in the molded product was 100% by weight and the coefficient of linear expansion was 25 ppm/K. While a crosslinked material with a 100% crosslinking ratio is presumed to undergo largest mold shrinkage, the density of this crosslinked material was 1.049 and the mold shrinkage caused by crosslinking (=density of crosslinked material/density of uncrosslinked material×100) was 0.3%. The crosslinked material was analyzed with a precision refractometer (KPR-2000 produced by Shimadzu Corporation) to measure the refractive index for d line (587 nm wavelength). The refractive index was 1.61. Even in a sample having the highest crosslinking ratio, the change in density was small and the refractive index was close to the refractive index of the uncrosslinked material shown in Comparative Example.

The transmittance at 587 nm wavelength was measured as in Example 1. The transmittance was 71% and high transparency was exhibited.

The crosslinked material was analyzed with an automatic birefringence analyzer KOBRA produced by Oji Scientific Instruments with parallel nicols. The phase difference distribution in the crosslinked material was 88 nm at maximum. Compared to the uncrosslinked material discussed in Comparative Example, the phase difference was reduced and the crosslinked material exhibited a low birefringence. This is presumably due to the progress of crosslinking and resulting relaxation of the orientation of the aromatic rings of benzocyclobutene.

Comparative Example

The same process as in Example 1 was conducted except that the 4-vinylbenzocyclobutene polymer described in Example 1 was heat molded at 170° C. for 30 minutes. An uncrosslinked molded product of the 4-vinylbenzocyclobutene polymer was obtained as a result. It was confirmed that the uncrosslinked molded product did not have a peak at 1500 cm$^{-1}$ attributable to the crosslinked material. The crosslinking ratio of the uncrosslinked molded product was 0%, the amount of the crosslinked structure represented by general formula (1) contained in the molded product was 0% by weight, and the coefficient of linear expansion was 84 ppm/K. The density of the uncrosslinked material was 1.052 g/cm$^3$. The transmittance at 587 nm wavelength was measured as in Example 1. The transmittance was 86% and high transparency was exhibited. The refractive index was measured as in Example 1. The refractive index was 1.61 which was the same as in Example 1.

The phase difference of the uncrosslinked material was measured as in Example 6. The phase difference distribution in the uncrosslinked material was 116 nm at maximum and a relatively high birefringence was exhibited.

The results of Examples 1 to 6 and Comparative Example are shown in Table 1.

Example 7

Polymerization of 4-vinylbenzocyclobutene

In 10 mL of tetrahydrofuran, 6.50 g (5 mmol) of 4-vinylbenzocyclobutene was dissolved and 11.8 mg (0.05 mmol) of 2,4-diphenyl-4-methyl-1-pentene serving as a chain transfer agent was added thereto. Then 8.14 mg (0.05 mmol) of 2,2'-azobisisobutyronitrile was dissolved. The mixture was placed in a glass tube. The glass tube was purged with nitrogen gas and hermetically sealed. The hermetically sealed glass tube was heated to 74° C. in an oil bath and polymerization was conducted for 48 hours. The polymer obtained was diluted with 50 mL of tetrahydrofuran and the diluted solution was added to a large volume of methanol dropwise so as to recover a 4-vinylbenzocyclobutene polymer as deposits.

The polymer recovered was dissolved in a deuterated chloroform solution and analyzed with a proton nuclear magnetic resonance analyzer CH NMR) (Avance 600 MHz produced by Bruker BioSpin K.K.) by using tetramethylsilane as a standard for chemical shift to confirm absence of remaining monomers and the chemical structure of the polymer.

The molecular weight of the 4-vinylbenzocyclobutene polymer obtained by GPC was Mn=5.62×10$^3$, Mw=1.32×10$^4$. The glass transition temperature determined by DSC was 112° C.

Production of Crosslinked Material

The 4-vinylbenzocyclobutene polymer (200 mg) was placed in a cylindrical mold (10 mm in diameter, 1.2 mm in height) and molding was conducted at 230° C. for 120 minutes while applying a pressure of 3 ton under a nitrogen stream to obtain a crosslinked material. The crosslinking ratio of the crosslinked material was calculated by FT-IR as mentioned above and the coefficient of linear expansion was calculated by TMA as mentioned above. The crosslinking ratio was 100% and the amount of the crosslinked structure represented by general formula (1) contained in the molded product was 100% by weight, and the coefficient of linear expansion was 12 ppm/K. The transmittance at 587 nm wavelength was measured as in Example 1. The transmittance was 72% and high transparency was exhibited.

Example 8

Polymerization of 4-vinylbenzocyclobutene

The same process as in Example 7 was performed to obtain a polymer except that 29.5 mg (0.125 mmol) of 2,4-diphenyl-4-methyl-1-pentene was added as the chain transfer agent.

The molecular weight of the 4-vinylbenzocyclobutene polymer obtained by GPC was Mn=5.09×10³, Mw=9.71×10³. The glass transition temperature obtained by DSC was 106° C.

Production of Crosslinked Material

A crosslinked material was produced by the same method as in Example 7. The crosslinking ratio was 79%. The amount of the crosslinked structure represented by general formula (1) contained in the molded product was 79% by weight and the coefficient of linear expansion was 14 ppm/K. The transmittance at 587 nm wavelength was measured as in Example 1. The transmittance was 76% and high transparency was exhibited.

Example 9

Polymerization of 4-vinylbenzocyclobutene

A polymer was obtained as in Example 7 except that 10.1 mg (0.05 mmol) of 2-tert-dodecylmercaptan was added as the chain transfer agent.

The molecular weight of the 4-vinylbenzocyclobutene polymer obtained by GPC was Mn=4.02×10³, Mw=1.07×10⁴. The glass transition temperature determined by DSC was 96° C.

Production of Crosslinked Material

A crosslinked material was produced by the same process as in Example 7. The crosslinking ratio was 71% and the amount of the crosslinked structure represented by general formula (1) contained in the molded product was 71% by weight. The coefficient of linear expansion was 20 ppm/K. The transmittance at 587 nm wavelength was measured as in Example 1. The transmittance was 64% and high transparency was exhibited.

Example 10

Polymerization of 4-vinylbenzocyclobutene

In 10 mL of tetrahydrofuran, 5.85 g (4.5 mmol) of 4-vinylbenzocyclobutene and 0.05 g (0.5 mmol) of methyl methacrylate were dissolved, and then 8.14 mg (0.05 mmol) of 2,2'-azobisisobutyronitrile was dissolved. The mixture was placed in a glass tube. The glass tube was purged with nitrogen gas and hermetically sealed. The hermetically sealed glass tube was heated to 74° C. in an oil bath and polymerization was conducted for 48 hours. The polymer obtained was diluted with 50 mL of tetrahydrofuran and the diluted solution was added to a large volume of methanol dropwise so as to recover a 4-vinylbenzocyclobutene-methyl methacrylate copolymer as deposits.

The copolymer recovered was dissolved in a deuterated chloroform solution and analyzed with a proton nuclear magnetic resonance analyzer CH NMR) (Avance 600 MHz produced by Bruker BioSpin K.K.) by using tetramethylsilane as a standard for chemical shift to confirm absence of remaining monomers and the chemical structure of the copolymer. The copolymerization ratio of the copolymer obtained was 4-vinylbenzocyclobutene:methyl methacrylate=88:12.

The molecular weight of the 4-vinylbenzocyclobutene-methyl methacrylate copolymer obtained by GPC was Mn=7.44×10³, Mw=1.84×10⁴. The glass transition temperature determined by DSC was 108° C.

A crosslinked material was produced by the same method as in Example by using the copolymer obtained. The crosslinking ratio was 67%, the amount of the crosslinked structure represented by general formula (1) contained in the molded product was 59% by weight, and the coefficient of the linear expansion was 21 ppm/K. The transmittance at 587 nm wavelength was measured as in Example 1. The transmittance was 75% and high transparency was exhibited.

The results of Examples 7 to 10 are shown in Table 2.

The results of Examples and Comparative Example revealed that the crosslinked materials according to the present invention have a low coefficient of linear expansion and are suitable for use in optical components and electronic boards.

TABLE 1

| | Heat treatment temperature (° C.) | Time (min) | Amount (% by weight) | Coefficient of linear expansion (ppm/K) | Density (g/cm³) |
|---|---|---|---|---|---|
| Example 1 | 230 | 30 | 23 | 39 | — |
| Example 2 | 230 | 60 | 41 | 24 | — |
| Example 3 | 230 | 90 | 50 | 21 | — |
| Example 4 | 230 | 120 | 50 | 20 | — |
| Example 5 | 250 | 90 | 91 | 24 | — |
| Example 6 | 290 | 10 | 100 | 25 | 1.049 |
| Comparative Example | 170 | 30 | 0 | 84 | 1.052 |

TABLE 2

| | Heat treatment temperature (° C.) | Time (min) | Amount (% by weight) | Coefficient of linear expansion (ppm/K) | Density (g/cm³) |
|---|---|---|---|---|---|
| Example 7 | 230 | 120 | 100 | 12 | — |
| Example 8 | 230 | 120 | 79 | 14 | — |
| Example 9 | 230 | 120 | 71 | 20 | — |
| Example 10 | 230 | 120 | 67 | 21 | — |

The present invention is suitable for use in optical components and electronic boards such as optical lenses, light guiding plates, protective films, deflection films, phase difference films, touch panels, transparent electrode substrates, optical recording discs such as CDs, MDs, and DVDs, TFT substrates, electronic materials and prepregs such as sealing materials for color filter substrates, resin clad copper foils, printed wiring boards, insulating sheets, and antenna substrates.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-130083 filed Jun. 7, 2012, which is hereby incorporated by reference herein in its entirety.

What is claimed is:

1. An optical component comprising:
  a polymer consisting of a repeating structural unit represented by general formula (1) and a repeating structural unit represented by general formula (2)

General formula (1)

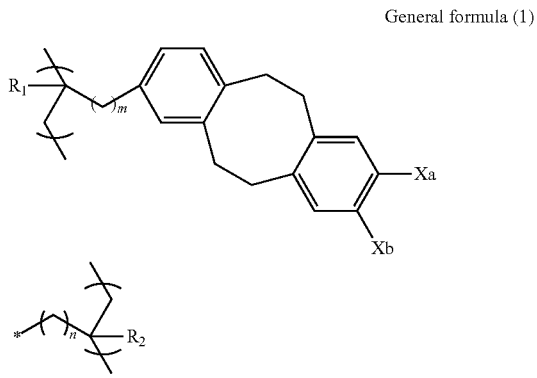

where R₁ and R₂ each independently represent —H or —CH₃; m and n each independently represent an integer in the range of 0 to 3; asterisk denotes a dangling bond that bonds to one of Xa and Xb; and —H bonds to the other one of Xa and Xb, General formula (2)

where R₃ represents —H or —CH₃ and s represents an integer in the range of 0 to 3.

2. The optical component according to claim 1, wherein when the total content of the repeating structural unit represented by general formula (1) and the repeating structural unit represented by general formula (2) contained in the polymer is assumed to be 100% by weight, the content of the repeating structural unit represented by general formula (1) is 20% by weight or more and less than 100% by weight.

3. The optical component according to claim 1, wherein when the total content of the repeating structural unit represented by general formula (1) and the repeating structural unit represented by general formula (2) contained in the polymer is assumed to be 100% by weight, the content of the repeating structural unit represented by general formula (1) is 60% by weight or more and less than 100% by weight.

4. The optical component according to claim 1, wherein when the total content of the repeating structural unit represented by general formula (1) and the repeating structural unit represented by general formula (2) contained in the polymer is assumed to be 100% by weight, the content of the repeating structural unit represented by general formula (1) is 95% by weight or more and less than 100% by weight.

5. The optical component according to claim 1, wherein the polymer does not have a structural unit represented by general formula (2)

General formula (2)

where R₃ represents —H or —CH₃ and s represents an integer in the range of 0 to 3.

6. The optical component according to claim 1, wherein the polymer is a homopolymer.

7. The optical component according to claim 1, wherein the repeating structural unit represented by general formula (1) is a structural unit represented by general formula (3)

General formula (3)

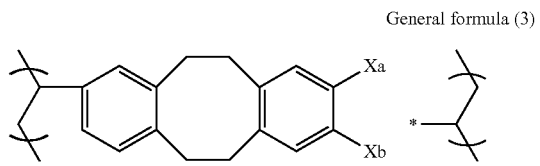

where asterisk represents a dangling bond that bonds to one of Xa and Xb and —H bonds to the other one of Xa and Xb.

* * * * *